United States Patent [19]

Cotton

[11] Patent Number: 4,769,688
[45] Date of Patent: Sep. 6, 1988

[54] POWER BIPOLAR TRANSISTOR

[75] Inventor: David R. Cotton, Bedford, United Kingdom

[73] Assignee: Texas Instruments Incorporated, Dallas, Tex.

[21] Appl. No.: 73,861

[22] Filed: Jul. 16, 1987

Related U.S. Application Data

[63] Continuation of Ser. No. 840,252, Mar. 17, 1986, abandoned.

[30] Foreign Application Priority Data

May 3, 1985 [GB] United Kingdom ............... 8511381

[51] Int. Cl.⁴ ................... H01L 29/72; H01L 27/02
[52] U.S. Cl. ........................................ 357/36; 357/34; 357/46; 357/51
[58] Field of Search ............... 357/36, 46, 51, 34

[56] References Cited

U.S. PATENT DOCUMENTS

| 3,225,261 | 12/1965 | Wolf | 317/101 |
|---|---|---|---|
| 3,427,511 | 2/1969 | Rosenzweig | 317/235 |
| 3,432,920 | 3/1969 | Rosenzweig | 29/578 |
| 3,453,503 | 7/1969 | Schulz et al. | 317/235 |
| 4,266,236 | 5/1981 | Veda | 357/34 |
| 4,345,266 | 8/1982 | Owyang | 357/34 |

FOREIGN PATENT DOCUMENTS

| 1537646 | 9/1967 | France | 357/36 |
|---|---|---|---|
| 58-132969 | 8/1983 | Japan | 357/36 |
| 59-106156 | 6/1984 | Japan | 357/36 |
| 61-42952 | 3/1986 | Japan | 357/36 |

Primary Examiner—James J. Carroll
Assistant Examiner—Ngan Ngo
Attorney, Agent, or Firm—Gary C. Honeycutt; Melvin Sharp; Rhys Merrett

[57] ABSTRACT

A bipolar power transistor having a plurality of elongated emitter parts connected to a common emitter metallization is provided with a shaped resistive region between the emitter parts and the emitter metallization, in order to compensate for differences in the resistance presented by the metallization itself.

3 Claims, 3 Drawing Sheets

POWER BIPOLAR TRANSISTOR

This application is a continuation of application Ser. No. 840,252, filed Mar. 17, 1986, abandoned.

This invention relates to a power bipolar transistor.

In order to keep to a minimum the switching time of a power transistor it has been established that the transistor should have a narrow emitter region, uniformity of current density within the semiconductor material, and a maximised emitter periphery per unit area. In addition, the uniformity of current distribution in the device helps to provide a large forward bias safe operating area (FBSOA) for the device. The required narrow emitter region and the maximised emitter periphery per unit area are provided in prior art devices by a comb shaped emitter region having narrow teeth. In effect the teeth of the emitter region act as the emitters of separate transistors connected in parallel. It has been found that where there is a high current density in part of the device that part becomes hotter than the rest with the result that more current is diverted to that part due to the increased local gain arising from the heating and this cumulative effect can result in destruction of the device. It has been proposed to control this thermal runaway by the disconnection of the "teeth" from the back of the comb structure and the provision of separate resistive regions all of the same resistive value joining the "back" to the teeth. In this arrangement the "back" is connected only to the resistive regions which form emitter series resistors serving to distribute the emitter current more uniformly throughout the device. Despite this it has been found that the maximum current through the transistor must be restricted to avoid overheating of some parts of the device.

It is an object of the present invention to provide an improved power bipolar transistor.

According to the present invention there is provided a power bipolar transistor in which different parts of the emitter are connected to a common emitter metallisation with an emitter terminal connection through respective resistance elements wherein each part of the emitter is connected to one or more distributed resistive regions, the resistance of which is chosen taking into consideration the resistance afforded by the metallisation between the emitter terminal connection and the particular part of the resistive region as to produce a predetermined current distribution through the transistor under particular working conditions.

The predetermined current distribution may be such that the temperature attained throughout the transistor is substantially uniform. Alternatively the predetermined current distribution may be such that the current density through the transistor is substantially uniform.

The emitter regions of a bipolar transistor according to this invention may be formed as separate narrow fingers. The resistive region extends from each emitter finger to the location where the omitter metallisation makes contact with the semi-conductor. The resistance of the resistive region may be varied at different parts of the transistor by altering the distance between the emitter finger and the metallisation, and hence the length of the resistive region. An embodiment of the invention will now be described by way of example only with reference to the accompanying drawings.

Figure 1:
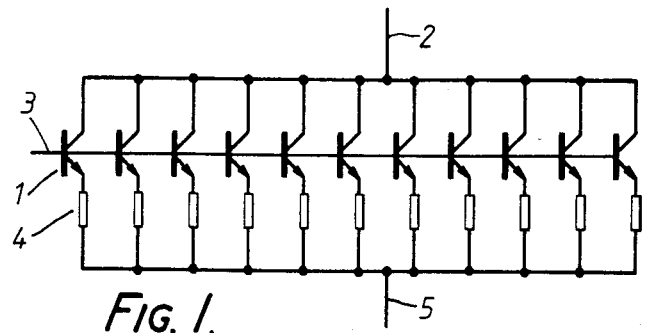
FIG. 1 is a circuit representation of a transistor having separate emitter resistors connected to different parts of the emitter.

FIG. 1 shows a discrete circuit representation of a distributed emitter transistor. The individual transistor elements 1 have common base 3 and common collector connections. The emitters are connected to a common terminal 5 by individual resistors 4, the values of which are chosen taking into consideration the resistance afforded by the metallic parts of the connections from the resistors 4 to the terminal 5. The total emitter resistance may be the same for each transistor element so as to provide an even distribution of current through the whole transistor. Alternatively the emitter resistance for the transistor elements in the middle of the substrate may be larger than that of the elements at the edges of the substrate to allow for the greater cooling there, thereby to give a uniform temperature over the transistor when in operation.

Figure 2:
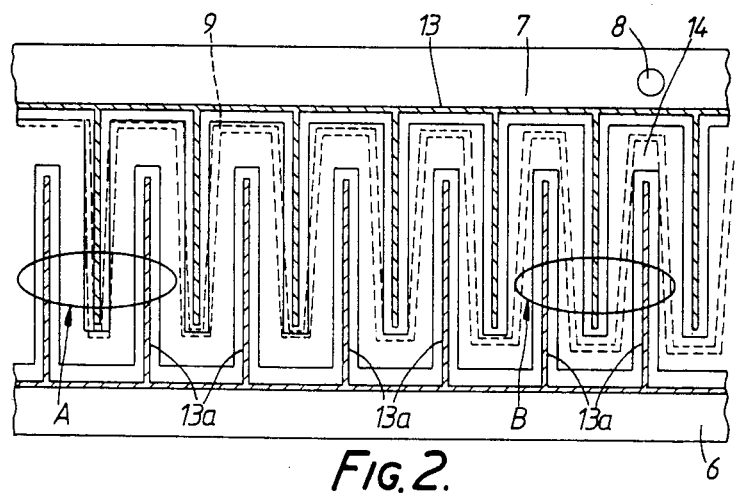
FIG. 2 shows a section of the emitter layout of a transistor according to the invention.

Part of a physical realisation of the circuit shown in FIG. 1 is shown in plan view in FIG. 2. Connection to the base region 11 and emitter region 9 of the transistor is made through finger like slots 13 and 13a, shown hatched in the figure, in the surface insulation by strips of the emitter metallisation 7 and base metallisation 6. The emitter region 9 is shown by two parallel dashed lines winding in between the slots 13 and 13a in a zig-zag fashion. The emitter 9 is connected to the emitter metallisation by a resistive region 10 extending from the emitter connection slots 13 to the emitter region itself. The spacing of the emitter region 9 from the emitter connection slot 13 is gradually reduced with increase in distance from an emitter contact point 8 on the emitter metallisation 7. The further away from the emitter contact point 8 it is the narrower is the resistive region used to connect the emitter region 9 to the emitter metallisation 7 and consequently the less resistance afforded to that part of emitter by the resistive region 10. This variation of the width of the resistive region may be arranged in such a way as to have an inverse relationship to the resistance afforded to each part of the emitter region by the emitter metallisation resulting in a constant emitter resistance for all the transistor elements. Alternatively the emitter resistance may be reduced in selected areas which have greater cooling so as to produce a substantially constant temperature over the transistor.

Figure 3:
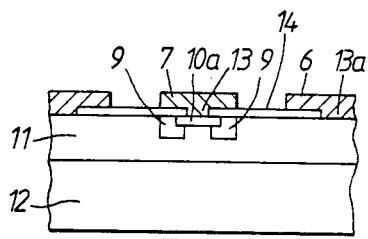
FIGS. 3 and 4 show cross sections of the transistor construction at A and B in FIG. 2.
Figure 4:
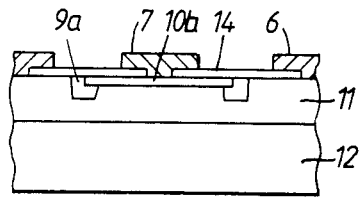

FIGS. 3 and 4 respectively show cross sections of the transistor at A and B in FIG. 2. The transistor comprises a collector region 12 and a base region 11 in which is formed the narrow emitter strip 9. The transistor may be of npn or pnp conductivity types, npn being preferred due to the faster switching times associated with this type of transistor resulting from the fact that electrons have a higher mobility than holes.

Connections to the base region 11 is made directly to the semiconductor by the base metallisation strip 6. Connection to the collector is made on the undersurface of the transistor and is not shown. The emitter 9 is connected to the emitter metallisation by the resistive region 10a in FIG. 3 and 10b in FIG. 4 this region corresponds to the resistors 4 shown in FIG. 1. The edges of the resistive region 10a and 10b extend into the emitter region 9, the emitter metallisation 7 making connection to the centre of the resistive regions 10a and 10b.

Since B is closer to the emitter contact point 8 than A as shown in FIG. 2 that part of the emitter region has less emitter metallisation resistance afforded to it. The resistive region 10b at B is made wider than the region 10a at A and so has a greater resistance than that at A. This variation in emitter resistance as well as compensating for differences between the resistance presented by the emitter metallisation at different parts of the transistor may be chosen so as to produce a desired current distribution in the transistor.

Figures 5, 6:
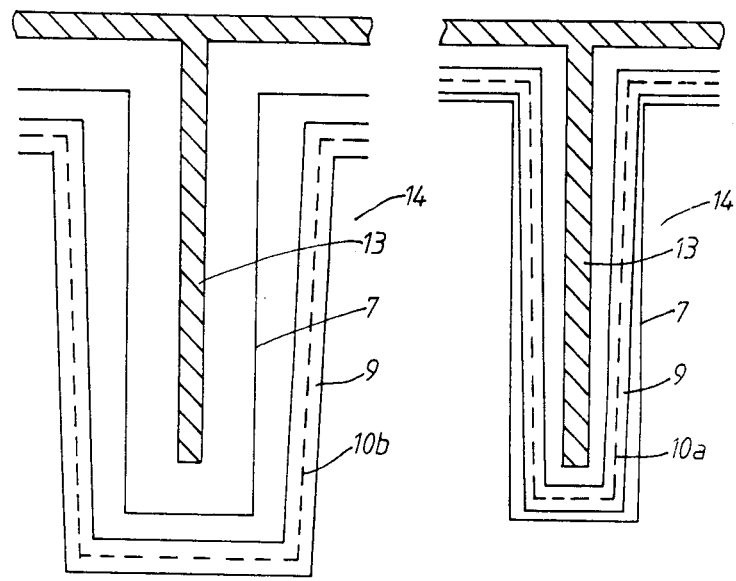
FIGS. 5 and 6 show plan views of the transistor construction at A and B in FIG. 2.

FIGS. 5 and 6 are plan views showing in more detail to the transistor elements at B and A respectively. The dotted line represents the edge of the resistive regions 10a and 10b extending into the emitter strip 9. The resistive regions 10a and 10b are tapered to allow for the added resistance afforded to the emitter by the emitter metallisation extending down the slot 13.

A transistor as described above may be fabricated by conventional processes. A substrate of a given conductivity type forms the collector region 12, onto this is formed a region of the opposite conductivity type this forming the base of the transistor. The base region may be produced by epitaxial deposition or by ion bombardment of the substrate. An insulating layer is then grown sealing the surface of the semiconductor. The insulating layer is then removed from selected regions of the transistor by a masking and etching process and a diffusion of a suitable dopant is carried out to form regions, of the same conductivity type as the collector region, in the base region these being the emitter regions. The insulating layer is then regrown. Another masking an etching step removes the insulating layer over regions which are to form the resistive regions 10. An ion implant of a suitable dopant of the same conductivity type as the emitter region is then carried out. This is then followed by a diffusion to give suitable penetration of the implanted dopant. This process gives accurate control of the resistive region then formed; the insulating layer is then reformed. Another masking and etching step produces slots for the base and emitter connections the transistor may then be completed using the standard power transistor process of contact, metal and sinter.

Figure 7:
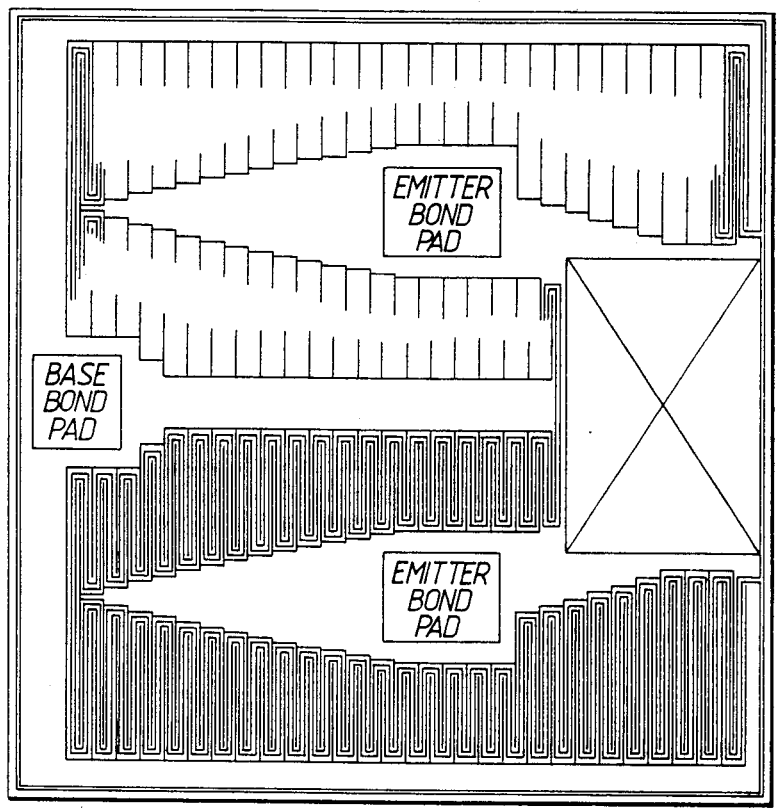
FIG. 7 is a plan view of a transistor according to the invention.

FIG. 7 shows a plan view of a layout of a transistor according to this invention. The emitter and base connections are made at the top of the transistor and the collector connection is made on the under surface of the substrate and is not shown.

A transistor as described above can exhibit a forward bias safe operating area far superior to that of prior art devices because of the possibility of eliminating local hot spots. The switching speed of the transistor may be enhanced and by suitable selection of the resistive region may exhibit only a few degrees temperature difference across its surface so may be operated with higher current densities than prior art devices without the risk of second breakdown allowing larger inductive loads to be driven for example.

I claim:

1. A bipolar transistor patterned in the surface of a semiconductor substrate, having a collector region, a base region, an emitter terminal, and a plurality of elongated emitter parts; a common emitter metallization; a resistive region in said semiconductor surface located between and in contact with said emitter parts and said metallization, said resistive region having a tapered geometry such that the resistive region becomes progressively more narrow with increasing distance from said emitter terminal, to provide a reduced resistance adjacent those portions of said metallization which are more distant from said emitter terminal, in order to compensate for the difference in resistance presented by the metallization at different parts of the transistor.

2. A bipolar transistor as claimed in claim 1 in which said tapered geometry is such that the temperature attained throughout the transistor is substantially uniform when operating under predetermined conditions.

3. A bipolar transistor as claimed in claim 1 in which the tapered geometry is such that the current density through the transistor is substantially uniform.

* * * * *